United States Patent
Honeycutt et al.

(10) Patent No.: US 6,239,029 B1
(45) Date of Patent: *May 29, 2001

(54) SACRIFICIAL GERMANIUM LAYER FOR FORMATION OF A CONTACT

(75) Inventors: Jeffrey Honeycutt; Sujit Sharan, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/146,850

(22) Filed: Sep. 3, 1998

Related U.S. Application Data

(60) Continuation-in-part of application No. 08/816,165, filed on Mar. 12, 1997, which is a division of application No. 08/503,385, filed on Jul. 17, 1995, now Pat. No. 5,644,166.

(51) Int. Cl.$^7$ .................................................. H01L 21/44
(52) U.S. Cl. ..................... 438/688; 438/682; 438/664; 438/658
(58) Field of Search .................................. 438/597, 683, 438/682, 664, 675, 661, 658

(56) References Cited

U.S. PATENT DOCUMENTS

| | | |
|---|---|---|
| 4,994,892 | 2/1991 | Zuleeg et al. . |
| 5,089,872 | * 2/1992 | Ozturk et al. . |
| 5,169,803 | 12/1992 | Miyakawa . |

(List continued on next page.)

FOREIGN PATENT DOCUMENTS

| | | | |
|---|---|---|---|
| 61-256732 | 11/1986 | (JP) | .................................... 21/302 |
| 3-161926 | 7/1991 | (JP) | ...................................... 21/28 |
| 4-147618 | 5/1992 | (JP) | ...................................... 21/28 |
| 4-192562 | 7/1992 | (JP) . | |
| 5-6995 | 1/1993 | (JP) | .................................... 257/770 |
| 07-135187 | 5/1995 | (JP) . | |
| WO 97/49122 | 12/1997 | (WO) . | |

OTHER PUBLICATIONS

"A1–GE Reflow Sputtering for Sub–Micron–Contact–Hole Filling," K. Kikuta, T. Kikkawa and M. Aoki, 1991. VMIC Conference Proceedings, Jun. 11–12, pp. 163–169.

Yasuo Takahasi, et al., Reduction Reaction of Native Oxide at the Initial Stage of GeH4 Chemical Vapor Deposition on (100)Si, Appl. Phys. Lett. vol. 57, No. 6, pp. 58–99–601.

*Primary Examiner*—Caridad Everhart
(74) *Attorney, Agent, or Firm*—Workman, Nydegger & Seeley

(57) ABSTRACT

A contact to a semiconductor substrate including a contact opening extending through an insulating layer to a doped active region of the semiconductor substrate. The contact opening can have a relatively high aspect ratio of 2:1 or greater. The contact further includes a refractory metal germanosilicide region at the bottom of the contact opening, a refractory metal germanide layer at the sidewalls of the contact opening, and an overlying refractory metal nitride layer. The refractory metals of the invention include at least tantalum, titanium, cobalt and mixtures thereof. The contact is metallized, preferably using tungsten or aluminum. The method of manufacturing the contact comprises etching the contact opening. A germane gas is used to clean native silicon dioxide from the bottom of the contact opening and to deposit a germanium layer thereon. A refractory metal layer is deposited over the germanium layer. After annealing in a nitrogen atmosphere at a temperature of about 600° C. or less, the contact opening is metallized with tungsten or aluminum.

17 Claims, 4 Drawing Sheets

U.S. PATENT DOCUMENTS

| | | | |
|---|---|---|---|
| 5,281,552 | 1/1994 | King et al. | 437/131 |
| 5,283,206 | 2/1994 | Sugano . | |
| 5,358,616 | 10/1994 | Ward | 204/192.15 |
| 5,401,674 | 3/1995 | Anjun | 437/190 |
| 5,534,463 | 7/1996 | Lee et al. | 437/195 |
| 5,589,713 | 12/1996 | Lee et al. . | |
| 5,644,166 | 7/1997 | Honeycutt et al. | 438/642 |
| 5,691,571 | 11/1997 | Hirose et al. . | |
| 5,789,317 | 8/1998 | Batra et al. | 438/642 |

* cited by examiner

SACRIFICIAL GERMANIUM LAYER FOR FORMATION OF A CONTACT

This is a continuation-in-part of U.S. patent application Ser. No. 08/816,165, filed Mar. 12, 1997, which is a divisional of Ser. No. 08/503,385 now U.S. Pat. No. 5,644,166, filed Jul. 17, 1995 and issued Jul. 1, 1997, each of said applications being incorporated herein by reference.

BACKGROUND OF THE INVENTION

1. The Field of the Invention

The present invention relates to the formation of high aspect ratio submicron VLSI contacts. More specifically, the present invention is directed to depositing a germanium layer into a contact opening using germane gas in order to remove native silicon dioxide from the contact opening. The germanium layer at the bottom of the contact opening is consumed during annealing to form a low resistance contact.

2. The Relevant Technology

Modem integrated circuits are manufactured by an elaborate process in which a large number of electronic semiconductor devices are integrally formed on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductive substrates described above.

The movement toward progressive miniaturization of semiconductor devices has resulted in increasingly compact and efficient semiconductor structures. This movement has been accompanied by an increase in the complexity and number of such structures aggregated on a single semiconductor integrated chip. As feature sizes are reduced, new problems arise which must be solved in order to economically and reliably produce the semiconductor devices. The submicron features which must be reduced include, for instance, the width and spacing of metal conducting lines as well as the size of various geometric features of active semiconductor devices.

As an example, the requirement of submicron features in semiconductor manufacturing has necessitated the development of improved means of making contact with the various structures. The smaller and more complex devices are achieved, in part, by reducing device sizes and spacing and by reducing the junction depth of regions formed in the semiconductor substrate. Among the feature sizes which are reduced in size are the contact openings through which electrical contact is made to active regions in the semiconductor devices. As both the contact size and junction depth are reduced, new device metallization processes are required to overcome the problems which have been encountered.

Historically, device interconnections have been made with aluminum or aluminum alloy metallization. Aluminum, however, presents problems with junction spiking. Junction spiking results in the dissolution of silicon into the aluminum metallization and aluminum into the silicon. Typically, when aluminum contacts with a silicon substrate directly, the aluminum eutectically alloys with the silicon substrate at temperatures lower than 450° C. When such a reaction occurs, silicon is dissolved into the aluminum electrode, and there is a tendency for silicon thus dissolved into the electrode to be precipitated at a boundary between the electrode and the substrate as an epitaxial phase. This increases the resistivity across the contact. Furthermore, aluminum in the electrode is diffused into the silicon substrate from the electrode and forms an alloy spike structure in the substrate.

The resulting alloy spike structure is a sharp, pointed region enriched in aluminum. The alloy spikes can extend into the interior of the substrate from the boundary between the electrode and the substrate to cause unwanted short circuit conduction at the junction of the semiconductor in the substrate, particularly when the junction is formed in an extremely shallow region of the substrate. When such an unwanted conduction occurs, the semiconductor device no longer operates properly. This problem is exacerbated with smaller device sizes, because the more shallow junctions are easily shorted, and because the silicon available to alloy with the aluminum metallization is only accessed through the small contact area, increasing the resultant depth of the spike.

Contact openings have also been metallized with chemical vapor deposited tungsten. This process has also proven problematic. The tungsten is typically deposited in an atmosphere of fluorine, which attacks the silicon, creating "wormholes" into the active region. Wormholes can extend completely through the active region, thereby shorting it out and causing the device to fail. Tungsten also presents a problem in that it does not adhere well directly to silicon.

3. Prior State of the Art

In order to eliminate the problems associated with the reaction between the silicon substrate and the metallization material, prior art solutions have typically used a diffusion barrier structure in which the reaction between the silicon substrate and the electrode is blocked by a barrier layer provided between the electrode and the substrate. Such a barrier layer prevents the diffusion of silicon and aluminum. It also provides a surface to which the tungsten will adhere and which will prevent tungsten and fluorine from diffusing into the active region.

Prior art FIGS. 1 through 4 of the accompanying illustrations depict one conventional method known in the art of forming contacts having a diffusion barrier. In FIG. 1, a contact opening 18 is etched through an insulating layer 16 overlying an active region 14 on a substrate 12. Insulating layer 16 typically comprises a passivation layer of intentionally-formed silicon dioxide in the form of borophosphosilicate glass (BPSG). Contact opening 18 provides access to active region 14 by which an electrical contact is made. Native silicon dioxide layer 20 is a thin layer which forms on the active region from exposure to ambient. As shown in FIG. 2, a titanium metal layer 22 is then sputtered over contact opening 18 so that the exposed surface of active region 14 is coated.

A high temperature anneal step is then conducted in an atmosphere of predominantly nitrogen gas ($N_2$). Native silicon dioxide layer 20 is dissolved and titanium metal layer 22 is allowed to react with active region 14 and change titanium metal layer 22 into a dual layer. As shown in FIG. 3, a titanium silicide ($TiSi_x$) layer 26 is formed by the anneal step, and provides a conductive interface at the surface of active region 14. A titanium nitride ($TiN_x$) layer 24 is also formed, and acts as a diffusion barrier to the interdiffusion of tungsten and silicon or aluminum and silicon, as mentioned above. Under such conditions, the lower portion of titanium metal layer 22 overlying active region 14, after dissolving native silicon dioxide layer 20, reacts with a portion of the silicon in active region 14 to form titanium silicide layer 26. Concurrently, the upper portion of titanium metal layer 22 reacts with the nitrogen gas of the atmosphere to form titanium nitride layer 24.

The next step, shown in FIG. 4, is metallization. This is typically achieved by chemical vapor deposition (CVD) of tungsten, or by the deposition of aluminum using any of the various known methods. These include aluminum reflow sputtering, and chemical vapor deposition. In the case of tungsten, the titanium nitride helps improve the adhesion between the walls of the opening and the tungsten metal. In the case of both tungsten and aluminum, the titanium nitride acts as a barrier against the diffusion of the metallization layer into the diffusion region and vice-versa.

Spiking and wormholes can still occur, even with the use of a deposition barrier, particularly when the diffusion barrier is too thin. This frequently occurs at the corners of the contact opening, where it is difficult to form a thick layer, particularly if the aspect ratio of the contact is high. Contact opening 18 of FIG. 3 is filled by an aluminum layer 32 in FIG. 4 which depicts the effects of spiking, with a spike 34 extending through active region 14, the effect of which is to short active region 14 out.

The compound titanium nitride (TiN) is well suited to forming a diffusion barrier, as it is extremely hard, chemically inert, an excellent conductor, and has a high melting point. It also makes excellent contact with other conductive layers. Titanium nitride is typically formed by the reaction of sputtered titanium during annealing in nitrogen, or can be deposited directly on the substrate by reactive sputtering, evaporation, chemical vapor deposition and the like before the deposition of the metallization.

As device dimensions continue to shrink and the contact openings become deeper and narrower, contact walls become vertical and most of the metal deposition techniques fail to provide the necessary step coverage to create adequate contact with the active area. Such narrow, high aspect ratio contact openings can result in a partial or total failure to make significant contact with the active region. Accordingly, it becomes increasingly difficult to produce the desired thickness of titanium at the bottom of the contact opening.

FIG. 5 shows the dimensions used to calculate the aspect ratio, which is the ratio of the height H to the width W. In order to introduce a sufficiently thick titanium metal layer 22 using conventional sputtering techniques and thereby create titanium nitride layer 24 such that is acts as an effective diffusion barrier, the aspect ratio of contact opening 18 is required to be kept relatively low, generally under 2:1.

The aspect ratios of contacts have been increased in the past by depositing the titanium layer using a collimator to directly sputter deposit plasma emanating from a target into the bottom of the contact openings on a semiconductor substrate. The use of a collimator to direct titanium metal layer 22 in FIG. 2 to the bottom of contact opening 18 prevents unwanted structures from forming on the walls of contact opening 18 and thereby plugging contact opening 18. A collimator having a honeycomb structure has an aspect ratio corresponding to the thickness of honeycomb structure divided by the diameter of the openings in the honeycomb structure. In order to deposit the thick layers of titanium needed for this conventional method, the honeycomb structure used in collimator sputtering has been required to have a high aspect ratio, typically around 2.5:1. This slows down the manufacturing process and reduces throughput. Higher aspect ratios also require a high surface area of the collimator. A consequence of a high surface area is a concomitant increase in particle contamination, and a reduced deposition ratio on the wafer.

Other undesirable effects result from the conventional contact forming method. For instance, a high temperature of 800° C. or greater is required during the anneal step to properly form titanium silicide layer 26 as shown in FIG. 3. In practice, high temperatures tend to cause loss to the titanium silicide layer and can cause the BPSG to crack and to reflow.

Another function of depositing a titanium layer in a contact opening is to remove native silicon dioxide ($SiO_2$) which forms whenever the silicon substrate is exposed to air. Typical native silicon dioxide layers have a thickness of about 20 Angstroms. Such a layer is shown at 20 in FIG. 1. Native silicon dioxide layer 20 is highly insulative and can cause a high contact resistance so as to result in failure of the device. Titanium metal layer 22 of FIG. 2 serves to carry away oxygen, breaking down native silicon dioxide layer 20. In the process, a portion of titanium metal layer 22 is consumed. As a result, even more titanium must be deposited in order to form an effective diffusion barrier.

Prior art methods employed plasma cleaning to remove the native silicon dioxide from the bottom of the contact openings prior to depositing titanium. These processes have proven unsatisfactory, as they are quite expensive, decrease throughput, and may require substantially higher rapid thermal processing (RTP) annealing temperatures. Furthermore, since native silicon dioxide grows in air, these methods do not prevent the reformation of native silicon dioxide in the contact openings once the methods are concluded.

For these reasons, there is a need in the art for an improved method of creating diffusion barriers in contacts that minimize the amount of material needed for effective diffusion barriers. This will in turn allow greater miniaturization of devices. Such a method would be more desirable if it also had increased throughput, lowered costs, and increased yields.

SUMMARY OF THE INVENTION

In accordance with the invention as embodied and described herein, the present invention comprises a submicron VLSI contact and a corresponding method for manufacturing the contact. The submicron VLSI contact comprises a substrate having formed thereon an active region. An insulating layer such as silicon dioxide or BPSG overlies the active region. A contact opening is etched through the insulating layer to access the underlying active region. At the bottom of the contact opening is formed a refractory metal germanosilicide region. At the sides of the contact opening is a refractory metal germanide layer. Over the refractory metal germanide layer and the refractory metal germanosilicide region is a refractory metal nitride layer. The remainder of the contact opening is filled with a metal such as tungsten or aluminum. The germanium used in forming the contact may be doped in order to avoid depleting the active region.

The corresponding method of manufacturing the high aspect ratio submicron contact comprises the following steps. First, a doped active region is formed within the semiconductor substrate. The maximum depth of the doped active region defines a junction depth. An insulating layer is formed, typically by covering the active region with BPSG, reflowing the BPSG, and planarizing it. Contact holes are then etched into the insulating layer down to the active region, typically using photolithography and dry etch procedures. The contact opening is then exposed to germane gas (GeH$_4$) at a temperature of between about 200° to 600° C., at a pressure of 1 to 150 Torr, and for a period of time of about 60 seconds. This time may vary, but should be sufficient to remove the native silicon dioxide layer that has grown at the bottom of the contact opening, and to deposit a germanium layer having a thickness that is preferably approximately the same as the thickness of a refractory metal layer that is to be subsequently formed. Next, the refractory metal layer is deposited over the germanium layer so as to have a thickness less than about one-half the junction depth. The refractory metal layer may be deposited with, for example, a sputtering process. Since the refractory metal layer may be much thinner than with conventional methods, the sputtering process may be completed with the use of a collimator having a lower aspect ratio.

The next step is to anneal the contact opening in an atmosphere of nitrogen gas (N$_2$). This is done at a lower temperature than the conventional method, with the preferred temperature being about 600° C. The anneal step causes a refractory metal germanosilicide region to form at the bottom of the contact opening and a refractory metal germanide layer to form at the sidewalls. An overlying refractory metal nitride layer, which has been found to be an effective diffusion barrier, is formed over both the refractory metal germanosilicide region and the refractory metal germanide layer.

Since a much thinner refractory metal layer can be deposited, the contact can have a higher aspect ratio. Aspect ratios greater than about 2:1 are attainable. The improved diffusion barrier of refractory metal nitride effectively prohibits spiking and wormholes from forming in the active region. Other advantages of the present invention include a higher yield and a more stable BPSG layer due to the use of a lower temperature anneal.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 4 also illustrates the consequences of an insufficient contact barrier, which are shown as spikes penetrating through the active region.

FIG. 5 also shows the dimensions of the contact opening used in calculating the aspect ratio.

DETAILED DESCRIPTION OF THE PREFERRED EMBODIMENTS

The present invention comprises a high aspect ratio submicron VLSI contact and a method for forming the high aspect ratio submicron VLSI contact. The present invention utilizes a sacrificial CVD germanium layer in order to form a more intimate electrical contact, and a more efficient diffusion barrier at the bottom of the contact. The method of the present invention is highly beneficial in the formation of electrical contacts to devices such as diodes, resistors, capacitors, transistors, and other semiconductor devices formed in high density on microchips. The method of the present invention, is shown by steps in FIGS. 1 and 5–8.

Figure 1:
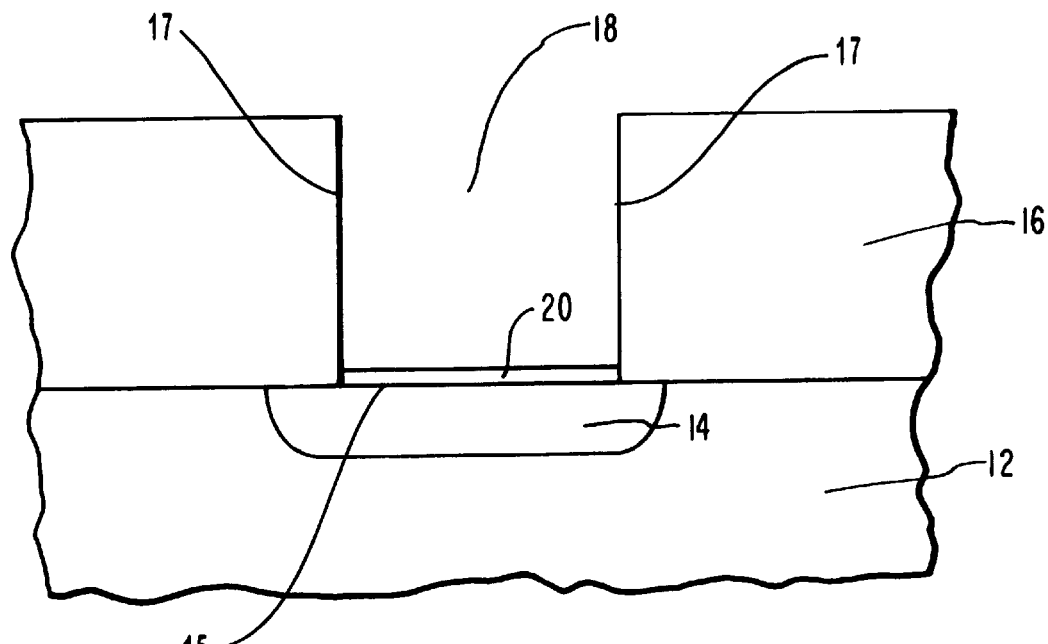
FIG. 1 is a cross-sectional elevation view showing the manner in which a typical contact opening is formed through an insulating layer to the surface of a semiconductor substrate.
Figure 2:
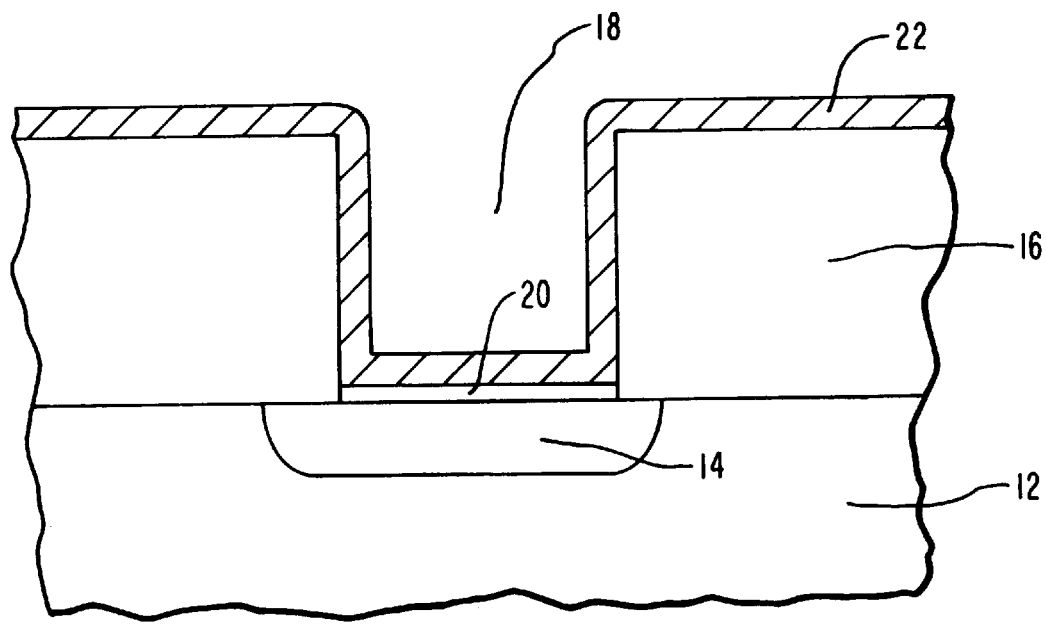
FIG. 2 is a cross-sectional elevation view illustrating the next step in the conventional known method for producing a contact, comprising depositing a titanium layer into the contact opening.
Figure 3:
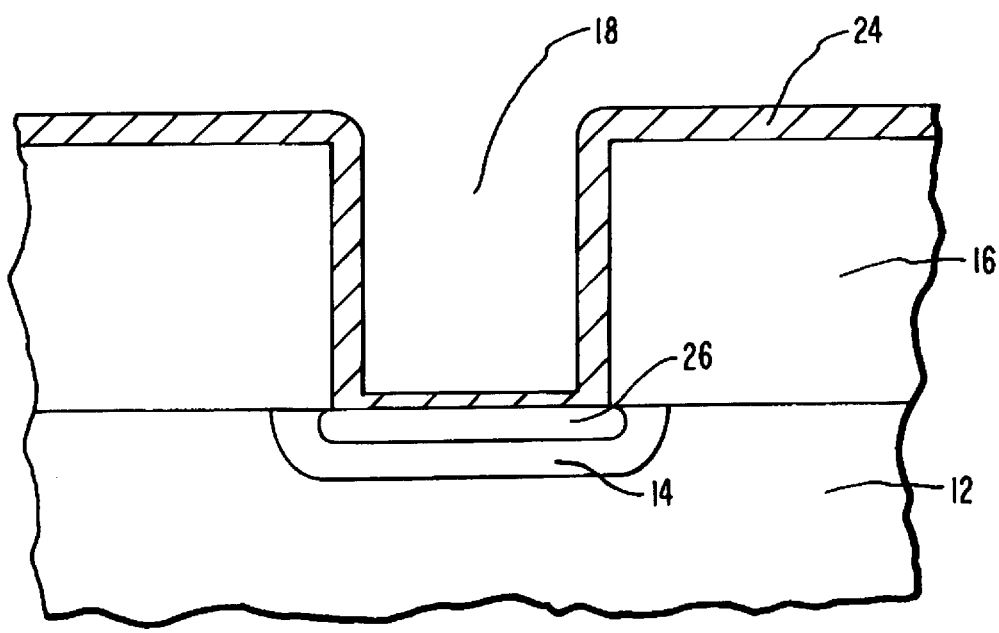
FIG. 3 is a cross-sectional elevation view illustrating the next step in the conventional known process for producing a contact, comprising annealing the titanium layer in a nitrogen gas atmosphere to deposit an underlying titanium silicide region and an overlying titanium nitride layer.
Figure 4:
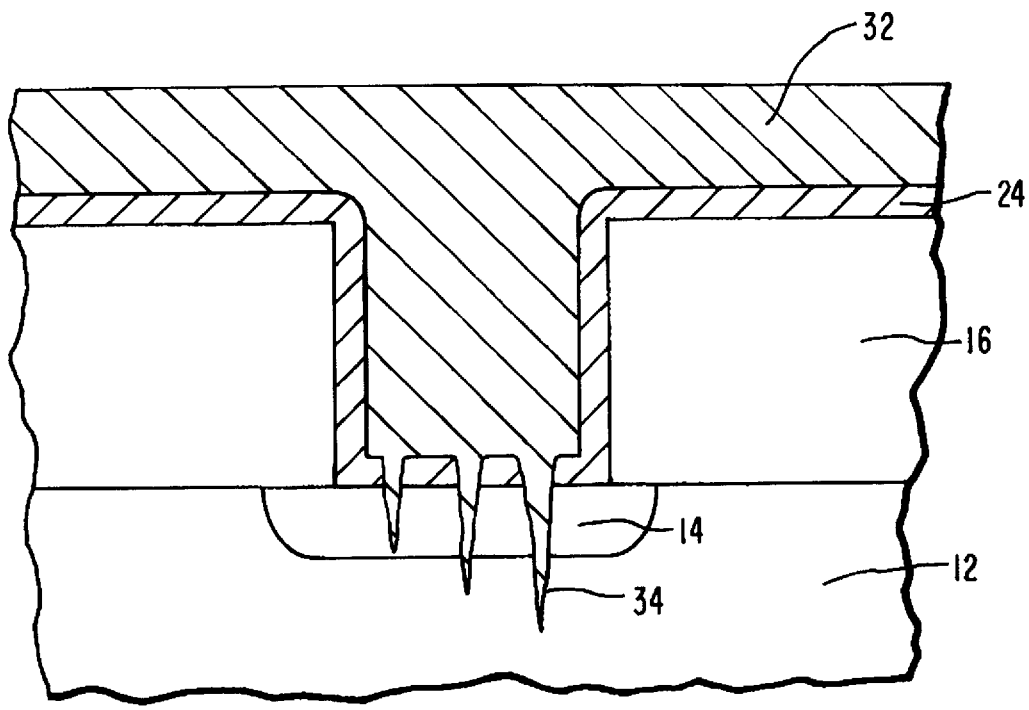
FIG. 4 is a cross-sectional elevation view illustrating the next step in the conventional known process for producing a contact, and comprises metallizing the contact opening.
Figure 5:
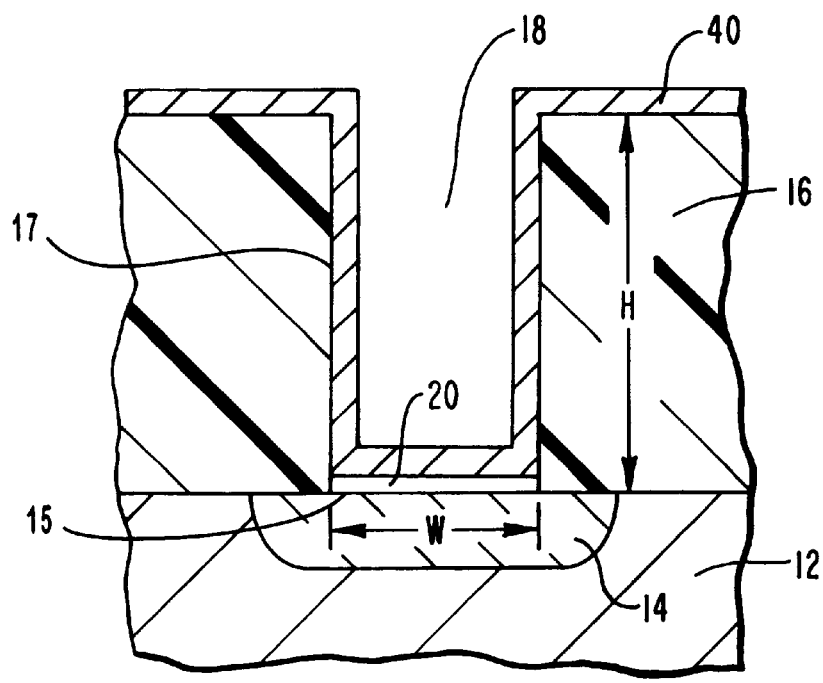
FIG. 5 is a cross sectional elevational view showing the results of a step for producing a high aspect ratio submicron VLSI contact under the present invention, and comprises exposing the contact opening to germane gas to deposit a germanium layer over the bottom of the contact opening.

Shown in FIG. 1 is a substrate 12 as the surface of a semiconductor substrate. An active region is created on substrate 12 by doping a portion thereof. The resulting doped active region is seen at reference numeral 14. The maximum depth of doped active region 14 defines a junction depth as used herein. Specifically, the maximum depth of doped active region 14 is in the direction perpendicular to the plane defined by substrate 12. The junction depth is not a limitation on the present invention, which instead contemplates essentially any junction depth that may be used in the art. The junction depth is important to the extent that it correlates to a preferred thickness of a refractory metal layer that is to be subsequently formed during the method as disclosed herein.

Next, a protective insulating layer 16 is formed over doped active region 14. Insulating layer 16 preferably comprises BPSG in order to allow it to reflow at temperatures of about 900° C. or below. Insulating layer 16 is preferably reflowed and planarized to form a flat surface on substrate 12. In order to access the underlying doped active region 14, a contact opening 18 is etched through insulating layer 16 by a process of masking and etching, preferably dry etching, as is commonly known in the art. Contact opening 18 extends through insulating layer 16 to doped active region 14 and has a bottom 15 and at least one sidewall 17.

In order to clean a native silicon dioxide layer 20 from bottom 15 of contact opening 18, and in order to form an effective diffusion barrier in preparation of metallizing contact opening 18, substrate 12 is exposed in a vacuum environment to germane gas (GeH$_4$). This is preferably done using a low pressure chemical vapor deposition (LPCVD)

technique. The process is preferably conducted with a pressure of about 80 Torr, a temperature of about 500° C., a germane concentration of about 100%, and for a duration of about 60 seconds. The germane gas effectively cleans native silicon dioxide layer 20 from bottom 15 of contact opening 18 by turning the silicon dioxide into a silicon sub-oxide ($SiO_x$) (X<2), which can be removed from the contact opening by sublimation in vacuum at a temperature of around 600° C. The cleaning of native silicon dioxide layer 20 from bottom 15 of contact opening 18 allows for optimal electrical contact between the metallization layer and underlying doped active region 14. It also allows an overlying refractory metal layer to be as thin as possible.

The LPCVD process should be of sufficient duration to remove native silicon dioxide layer 20 and to also deposit a germanium layer 40 at bottom 15 of contact opening 18. In practice, for example, and not by way of limitation, the thickness of germanium layer 40 will typically be in a range from about 30 Angstroms to about 100 Angstroms. More specifically, however, the thickness of germanium layer 40 will be selected to be in a range less than to slightly greater than the thickness of a refractory metal layer 48 that is to be subsequently formed. Preferably, the thickness of germanium layer 40 and the thickness of refractory metal layer 48 are approximately the same. The factors that determine the actual dimensions of these thickness will be more fully disclosed below.

Figure 6:
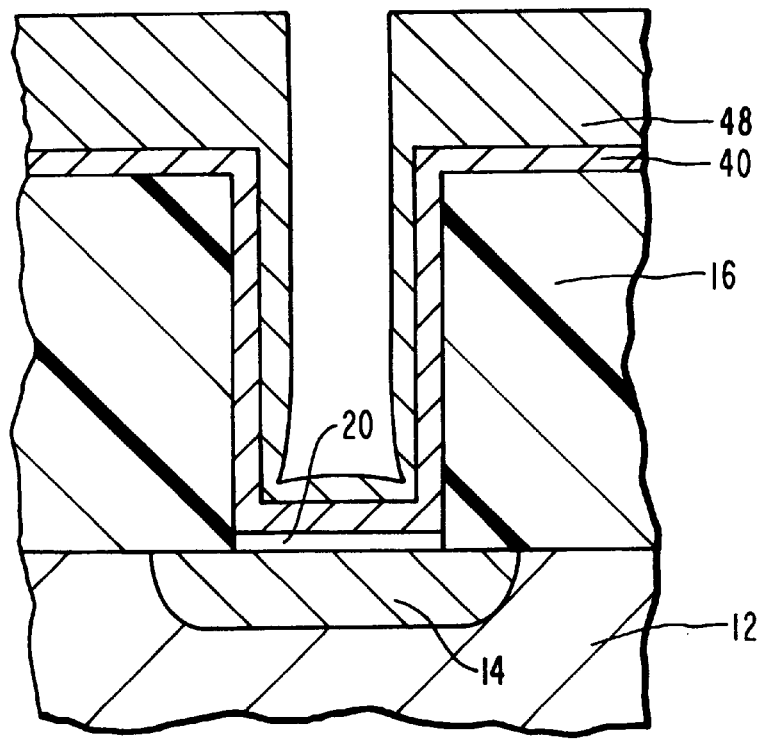
FIG. 6 is a cross-sectional elevation view illustrating the next step of the process of the present invention, comprising depositing a refractory metal layer over the germanium layer.

As shown in FIG. 6, a refractory metal layer 48 is then formed over germanium layer 40. Refractory metal layer 48 may be deposited by sputtering, CVD, or by other processes by which refractory metal is deposited. As used herein "refractory metal" may be chromium, cobalt, molybdenum, platinum, tantalum, titanium, tungsten, zirconium, or combinations thereof. It has been found that tantalum, titanium, cobalt, and a mixture of cobalt and titanium are particularly useful under the present invention.

Refractory metal layer 48 should be formed so as to have a thickness less than about one-half the junction depth. Providing such a thickness will significantly reduce the likelihood that junction leakage will occur in the completed contact. Limiting the thickness of refractory metal layer 48 reduces the amount of silicon removed from the doped active area to form refractory metal germanosilicide during subsequent steps of the method of the present invention. Since the refractory metal need not react with the silicon dioxide as in the conventional method, refractory metal layer 48 may be much thinner than typically used, typically a reduction from about 150 Angstroms, as used in conventional processes, to perhaps 50 Angstroms or less, depending on the junction depth.

Since less refractory metal need to be laid in bottom 15 of contact opening 18 than with the conventional process, the aspect ratio of contact opening 18 may be substantially increased. As a result, aspect ratios above 2:1 are now attainable with the present invention. This increase in aspect ratio in turn increases the number of devices that may be placed on a microchip, thereby aiding in the miniaturization process.

Refractory metal layer 48 is preferably deposited using a honeycomb structured collimator sputtering technique. By allowing a thinner refractory metal layer 48, the aspect ratio of the holes in the honeycomb structure of the collimator may be reduced. In conventional processes, the aspect ratio of the collimator is about 2.5:1. Using the current invention, this can be reduced to 2:1 or even as low as about 1.5 to 1. This speeds up the process, and due to the reduced surface area of the collimator, results in lower particle contamination. This will in turn result in a higher device yield.

During the LPCVD process, the germanium can be doped in situ, with either N+ or P+ dopants, depending on whether the underlying junction is doped with N+ or P+ dopants. This can be done by adding sources of boron, phosphorus, arsenic or other dopants to the LPCVD procedure. Examples of dopants are phosphine ($PH_3$), used with a P+ active region, and diborane ($B_2H_6$), used with a N+ active region. This will prevent germanium layer 40 from reacting with and depleting the dopant of doped active region 14. Instead, the dopant concentration in doped active region 14 will be substantially consistent throughout the method of the present invention.

Figure 7:
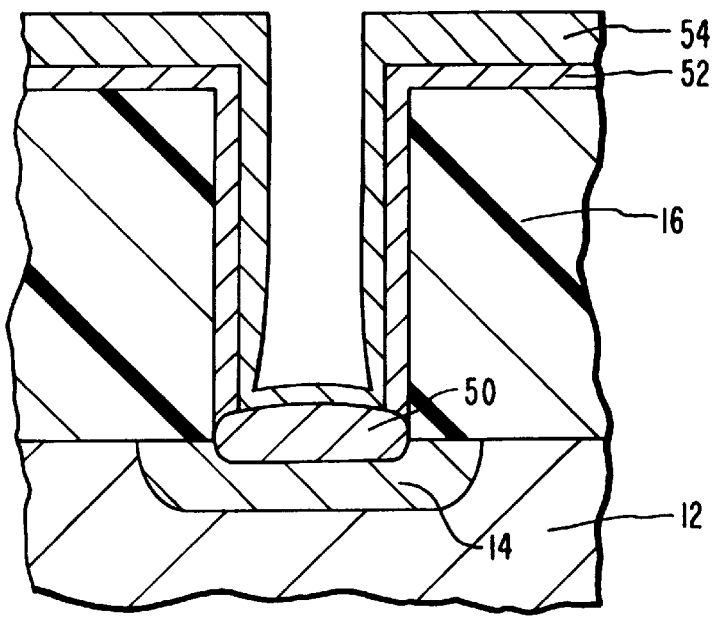
FIG. 7 is a cross sectional elevation view illustrating the next step of the process of the present invention, which is annealing the contact opening in a nitrogen gas atmosphere to form a refractory metal germanosilicide region at the bottom of the contact opening, a refractory metal germanide layer at the sidewalls of the contact opening, and an overlying refractory metal nitride layer.

Next, contact opening 18 is annealed, the result of which is shown in FIG. 7. This is preferably done using rapid thermal processing (RTP) in an atmosphere of nitrogen gas ($N_2$) and for a time period of about 20 to 60 seconds. The anneal step may be conducted at substantially lower temperatures than with conventional techniques. For example, conventional techniques use a temperature of about 800° C. for the anneal, while the method of the present invention may use a temperature of about 600° C. or less, with about 600° C. being preferred.

As a result of the anneal step, a refractory metal germanosilicide ($RSi_xGe_y$) region 50, where R represents a refractory metal, is formed at bottom 15 of contact opening 18 and over doped active region 14. A refractory metal germanide ($RGe_y$) layer 52 is also formed at sidewalls 17 of contact opening 18. The nitrogen gas also combines with refractory metal layer 48 to form a refractory metal nitride (RN) layer 54 above both refractory metal germanosilicide region 50 and refractory metal germanide layer 52. Germanium layer 40 is sacrificially consumed in the process. The alloy will vary, but it is preferred that variable X in ($RSi_xGe_y$) have a value of about 1, that variable Y in ($RSi_xGe_y$) have a value of about 1, and that variable Y in ($RGe_y$) have a value of about 2. As previously mentioned, refractory metal, R, may be a combination of individual metals, for example, titanium and cobalt. In this case, $RSi_xGe_y$ could be expressed as $Ti_wCo_{1-w}Si_xGe_y$, where 0<w<1, and with variables X and Y preferably each having a value of about 1.

Refractory metal germanosilicide can be formed at lower temperatures than refractory metal silicide ($RSi_x$), allowing a lower temperature anneal. This has the additional benefits of stabilizing the contact, avoiding cracking or detrimental reflow effects of the BPSG insulating layer, and helping to maintain the size of the doped active region 14.

Figure 8:
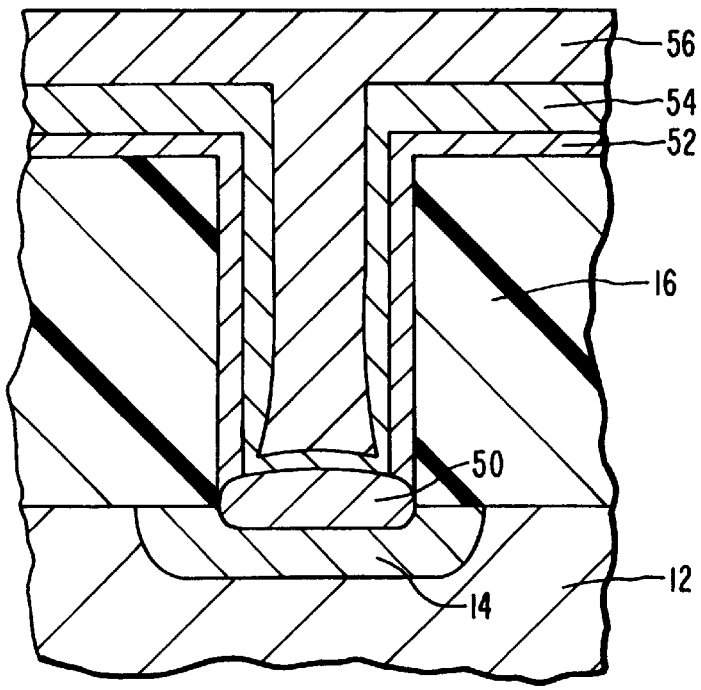
FIG. 8 is a cross sectional elevation view showing the last step of the process, which comprises metallizing the contact opening with a metal such as tungsten or aluminum

The final step, shown in FIG. 8, is metallization. In this step, a metallization material 56 is deposited in contact opening 18 and in physical contact with refractory metal nitride layer 54 such that contact opening 18 is substantially filled. Metallization material 56 is preferably tungsten formed in a CVD process or aluminum formed in a reflow, sputter, or CVD process.

The resulting contact has high step coverage with strong adhesion, high electrical conduction, and can be more easily miniaturized as a result of the higher aspect ratio permitted. The process can also be conducted at lower temperatures and with higher throughput. Refractory metal nitride layer 54 acts as an effective diffusion barrier to resist pitting, spiking, and wormholes. The resulting microchip has better reliability and a higher yield.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming a contact to a substrate, said method comprising:

providing an active region in said substrate, wherein a junction depth is defined as the maximum depth of said doped active region in a direction perpendicular to a plane defined by said substrate;

forming an insulating layer over said substrate;

forming in said insulating layer a contact opening extending to said active region, said contact opening having a bottom and at least one sidewall;

exposing a silicon dioxide layer on said substrate over said active area to germane gas so as to react with and remove said silicon dioxide layer from said substrate, and to form a germanium layer at said bottom of said contact opening and over said active region; and forming a refractory metal layer over said germanium layer, said refractory metal layer having a thickness that is less than about one-half of said junction depth.

2. A method as recited in claim 1, wherein exposing said silicon dioxide layer on said substrate over said active area to germane gas is conducted by CVD of germanium.

3. A method as recited in claim 1, wherein forming said refractory metal layer comprises deposition of a refractory metal material selected from the group consisting of chromium, cobalt, platinum, tantalum, titanium, tungsten, zirconium, and combinations thereof.

4. A method as recited in claim 3, wherein deposition of said refractory metal material comprises sputter deposition using a collimator having a honeycomb structure with an aspect ratio of less than about 2.5:1.

5. A method as recited in claim 1, wherein said germanium layer has a thickness that is about the same as said thickness of said refractory metal layer.

6. A method as recited in claim 1, further comprising, after exposing said silicon dioxide layer on said substrate over said active area to germane gas, annealing said substrate in a nitrogen gas at a temperature less than about 600° C. so as to form a refractory metal germanosilicide region at said bottom of said contact opening, a refractory metal germanide layer at said at least one sidewall of said contact opening, and a refractory metal nitride layer over said refractory metal germanosilicide region and said refractory metal germanide layer.

7. A method as recited in claim 1, further comprising, while exposing said silicon dioxide layer on said substrate over said active area to germane gas, doping said germanium layer with a first dopant compatible with a second dopant that is included in said active region such that a substantially consistent concentration of said second dopant in said doped active region is maintained.

8. A method as recited in claim 1, wherein said contact opening has an aspect ratio greater than about 2:1.

9. A method of forming a contact to a substrate, said method comprising:

forming a doped active region in said substrate, wherein a junction depth is defined as the maximum depth of said doped active region in a direction perpendicular to a plane defined by said substrate;

forming an insulating layer over said substrate;

forming in said insulating layer a contact opening extending to said doped active region, said contact opening having a bottom and at least one sidewall;

exposing at least said bottom of said contact opening to germane gas to react with and clean a native silicon dioxide layer from said bottom of said contact opening and to form a germanium layer over said contact opening;

forming a refractory metal layer on said germanium layer, said refractory metal layer having a thickness less than about one-half the junction depth;

annealing said substrate in an atmosphere of nitrogen gas to form a refractory metal germanosilicide region at said bottom of said contact opening, a refractory metal germanide layer at said at least one sidewall of said contact, and a refractory metal nitride layer over said refractory metal germanosilicide region and said refractory metal germanide layer; and forming a metallization material within said contact opening and in physical contact with said refractory metal nitride layer.

10. A method as recited in claim 9, wherein forming said refractory metal layer comprises sputter deposition of titanium.

11. A method as recited in claim 9, wherein forming said refractory metal layer comprises sputter deposition of tantalum.

12. A method as recited in claim 9, wherein forming said refractory metal layer comprises sputter deposition of cobalt.

13. A method as recited in claim 9, wherein forming said refractory metal layer comprises sputter deposition of both titanium and cobalt.

14. A method as recited in claim 9, wherein said annealing is conducted at a temperature less than about 600° C.

15. A method of forming a contact to a semiconductor substrate, said method comprising:

forming a doped active region in said substrate, wherein a junction depth is defined as the maximum depth of said doped active region in a direction perpendicular to a plane defined by said substrate;

forming an insulating layer over said substrate;

forming in said insulating layer a contact opening extending to said doped active region, said contact opening having a bottom and at least one sidewall, said contact opening further having an aspect ratio greater than about 2:1;

exposing at least said bottom of said contact opening to germane gas to react with and remove a native silicon dioxide layer from said bottom of said contact opening and to form a germanium layer over said contact opening;

forming on said germanium layer a refractory metal layer having a thickness less than about one-half the junction depth, said refractory metal layer being formed using a collimator having a honeycomb structure with an aspect ratio less than about 2.5:1;

annealing said substrate in an atmosphere of nitrogen gas at a temperature of less than about 600° C. to form a refractory metal germanosilicide region at said bottom of said contact opening, a refractory metal germanide layer at said at least one sidewall of said contact opening, and a refractory metal nitride layer over said refractory metal germanosilicide region and said refractory metal germanide layer; and forming a metallization material within said contact opening and in physical contact with said refractory metal nitride layer such that said contact opening is substantially filled.

16. A method as recited in claim 15, wherein said germanium layer has a thickness that is about the same as said thickness of said refractory metal layer.

17. A method as recited in claim 15, wherein exposing said bottom of said contact opening to said germane gas comprises simultaneously doping said germanium layer with a first dopant compatible with a second dopant that is included in said doped active region such that a substantially consistent concentration of said second dopant in said doped active region is maintained.

* * * * *

UNITED STATES PATENT AND TRADEMARK OFFICE
CERTIFICATE OF CORRECTION

PATENT NO.   : 6,239,029 B1
DATED         : May 29, 2001
INVENTOR(S)  : Jeffrey Honeycutt and Sujit Sharan It is certified that error appears in the above-identified patent and that said Letters Patent is hereby corrected as shown below:

Column 3,
Line 48, before "acts" change "is" to -- it --

Column 5,
Line 38, after "In order" change "that" to -- to illustrate --

Column 6,
Line 22, after "aluminum" insert a period

Signed and Sealed this

Thirtieth Day of April, 2002

Attest:

Attesting Officer

JAMES E. ROGAN
*Director of the United States Patent and Trademark Office*